United States Patent [19]

Schachner et al.

[11] Patent Number: 4,734,339
[45] Date of Patent: Mar. 29, 1988

[54] BODY WITH SUPERHARD COATING

[75] Inventors: Herbert Schachner, Grand-Lancy; Heinz Tippmann, Le Lignon; Benno Lux, Scuol/GR, all of Switzerland; Klas G. Stjernberg, Huddinge; Anders G. Thelin, Vällingby, both of Sweden

[73] Assignee: Santrade Limited, Luzern, Switzerland

[21] Appl. No.: 747,961

[22] Filed: Jun. 24, 1985

[30] Foreign Application Priority Data

Jun. 27, 1984 [SE] Sweden ................... 8403429

[51] Int. Cl.⁴ .................. B24D 3/02; C04B 31/16
[52] U.S. Cl. .................... 428/701; 428/698; 428/699; 428/469; 428/472
[58] Field of Search ............. 428/698, 699, 701, 702, 428/469, 472, 627, 629, 634, 669

[56] References Cited

U.S. PATENT DOCUMENTS

| 3,714,334 | 5/1971 | Vickery . |
| 3,831,428 | 8/1974 | Wentorf et al. ............ 72/467 |
| 3,913,280 | 10/1975 | Hall ....................... 51/307 |
| 4,403,015 | 9/1983 | Nakai et al. ............ 428/699 X |
| 4,434,188 | 11/1982 | Kamo et al. . |

FOREIGN PATENT DOCUMENTS

| 1366544 | 6/1964 | France . |
| 58-91100 | 5/1983 | Japan . |
| 58-110494 | 7/1983 | Japan . |
| 58-135117 | 8/1983 | Japan . |

OTHER PUBLICATIONS

"Vapour Growth of Diamond on Diamond and Other Surfaces", B. V. Spitsyn et al., J. of Crystal Growth 52 (1981), 219–226.
"Growth of Diamond Particles from Methand–Hydrogen Gas, S. Matsumoto et al., J. of Materials Science 17 (1982), 3106–3112.
"Growth of Diamond Seed Crystals from the Vapour at Subatmospheric Pressure", J. C. Angus et al., J. of Cryst. Growth (1968), 172.
"Growth of Diamond Seed Crystals by Vapour Deposition", J. C. Angus et al., J. Appl. Phys. 62 (10) (1981), 6151–6156.
"Structural Investigation of Thin Films of Diamond Like Carbon", H. Vora et al., J. Appl. Phys. 62 (19) (9181), 6151–6156.
"Growth of Boron–Doped Diamond Seed Crystals by Vapour Deposition", D. J. Poferl et al., J. Appl. Phys. 44 (4) (1973), 1428–1434.
"Kinetics of Carbon Deposition on Diamond Powder", S. P. Chauhan et al., J. Appl. Phys. 47 (11) (1976), 4748–4754.
X?, Technocrat, vol. 15, No. 5, May 1982, p. 79.
"Diamantsynthese Bei Temperaturen Unter 1300° C. Und Drucken Unter Einer Atmosphare", R. Diehl, Z.Dt.Gemmol.Ges. 26 (1977), 128–134.
"Color Chart for Diamond–Like Carbon Films on Silicon", T. J. Moravec, Thin solid Films 70 (1980), L9–L10.
"Growth of Diamond Films on Its Own and Foreign Surfaces", B. V. Derjaguin et al., 6. Int. Conf. for Crystal Growth, Moscow 1980, Extended Abstracts, vol. 1, pp. 307–310.
"Growth of Polycrystalline Diamond Films from the Gas Phase", V. P. Varnin et al., Kristallographia 22 (1977), Soviet Phys. Crystallogr. 22 (4) (1977), 513–515.
"Growth of Polycrystalline Diamond Films from the Gas Phase", Soviet Phys.-JETP, 42 (4) (1976), 839–840.

*Primary Examiner*—Nancy A. B. Swisher
*Attorney, Agent, or Firm*—Burns, Doane, Swecker & Mathis

[57] ABSTRACT

The present invention relates to a compound body consisting of a substrate with a surface coating of one or more dense, finegrained diamond layers, where the diamond grains are directly bonded to each other. Extreme hardness makes the compound body suitable for wear parts- and tools applications. Very good heat conductivity and an extremely high electrical isolation resistance makes the compound body extremely useful to lead away heat in electronic components.

14 Claims, No Drawings

BODY WITH SUPERHARD COATING

The present invention relates to a compound body comprising a substrate with a surface coating of one or more dense, fine-grained diamond layers, where the diamond grains are directly bonded to each other. The coating is characterised by an extremely high hardness, which makes the compound body suitable for wear parts and tools applications. The coating is also characterised by a very good heat conductivity combined with an extremely high electrical isolation resistance, which makes the compound body most useful in the electronic industry to conduct heat in electronic components.

Diamond coatings have earlier been produced by sintering diamond powder on a substrate at high pressure and high temperature. A drawback with this method is that the choice of substrate materials is very limited. In practice only various hardmetals can be a possible choice. Furthermore, it is not possible to obtain pure diamond coatings since a certain amount of the substrate material penetrates the diamond layer. A further drawback is that only small parts can be coated. The dimensions can in no direction exceed about three centimetres.

A further method of obtaining diamond layers is known. By CVD (Chemical Vapour Deposition) layers with some micrometers thickness can be obtained. The method is described in several Russian and Japanese papers e.g.:

1. Vapour Growth of Diamond on Diamond and Other Surfaces. B. V. Spitsyn et al., J. of Crystal Growth 52(1981), 219–26
2. Growth of Diamond Particles from Methane-Hydrogen Gas. S. Matsumoto et al., J. of Materials Science 17(1982), 3106–12
3. Japanese Patent. Kokai No. 58-9100. Matsumoto. May 30, 1983
4. Japanese Patent. Kokai No. 58-110494. Matsumoto. July 1, 1983
5. Japanese Patent. Kokai No. 58-135117. Matsumoto. Aug. 11, 1983

Drawbacks with the method are that you can not obtain such thick layers as often desired, and further that the layers often have bad adherence to the substrate material.

It has now turned out that improved adhesion of diamond layers is obtained on certain types of materials. Thus, it has turned out that good adherence is obtained to metals with high affinity to carbon but also to certain carbides, nitrides and oxides, and also to most noble metals. By coating the substrate with a thin layer of some of the above mentioned materials prior to the diamond deposition, improved adhesion is obtained.

By interrupting the diamond deposition process with equal intervals and depositing layers of the above mentioned materials a thick coating can be built up, consisting mainly of diamond, and having good adhesion to the substrate.

It should be observed, that the non-diamond layers may be extremely thin, e.g about 10 Å, but they may also be thicker e.g. up to about 10 μm.

According to the invention there now exists a compound body with improved adhesion and a thick diamond coating.

In one embodiment the substrate can comprise carbides, nitrides, carbonitrides, oxycarbides and borides of metals from group 4b to 6b of the periodic system bonded by metals of the iron group. The carbides in this embodiment comprise carbides such as WC, TaC, TiC, $Mo_2C$, $Cr_3C_2$, VC, MoC and the like. Carbonitrides such as (Ti,Mo)(C,N) and oxycarbides such as Ti(C,O) are also possible.

The nitrides comprise all metal nitrides with the exception of saltlike nitrides such as the alkali and earth alkali metals. The useful nitrides are generally those of the transition metals. They are generally described just as the carbides, borides and silicides as refractory hard materials. Compounds of the metal nitrides and compounds of nitrides with carbides in solid solution are also useful in this invention. Special examples of nitrides and compounds that can be mentioned are: silicon nitride, titanium nitride, zirconium nitride, vanadium nitride, chromium nitride, niobium nitride, molybdenum nitride, tantalum nitride, tungsten nitride and hafnium nitride. Boride include: titanium borides, zirconium borides, chromium borides, cobalt borides, molybdenum borides, niobium borides, iron borides and others.

The iron group metals comprise Ni, Co and Fe.

Among the materials included in this embodiment are cemented carbide, high speed steel, tool steel etc.

In another embodiment the substrate contains ceramic and refractory material such as BN, $Si_3N_4$, oxides of metals from groups 4b to 6b in the periodic system and Al and Si, SiAlON, AlON and mixtures of $Al_2O_3$ with TiC and TiN. Among the ceramic oxides the following can be mentioned: $SiO_2$, $Al_2O_3$, $ZrO_2$, $TiO_2$ and the like. The ceramic materials useful in the invention comprise a great number of products from crystalline to completely vitreous substances. The ceramic comprises also non oxide materials such as the metal carbides, -nitrides, -borides and -silicides already mentioned as well as mixtures with the above mentioned oxides. Ceramics according to the invention also include what is called cermets and composites of ceramics and metal.

According to still another embodiment the substrate can be a noble metal. The noble metals include Ag, Au, Pt, Pd, Ru, Os and Ir. Of course also alloys of these metals in any proportions are included. The substrate may also consist of other metals than the noble metals as well as alloys of two or more metals possibly including noble metals. The preferred metals are those from group 1b to 7b and 8 in the periodic system and comprise e g Cu, Zn, Cd, Al, In, Si, Sn, Pb, Mo, W, Mn, Fe, Co, Ni and the like.

Subclaim 2 is directed to compound bodies with at least two layers in the coating of which at least one is of diamond. Between this diamond layer and the substrate is situated a non-diamond layer the purpose of which is to improve the adhesion between the diamond layer and the substrate. This layer should not be of the same material as the substrate. It is suitable to chooses an intermediate layer of metals that form stable carbides e.g. metals from the group 4b to 6b of the periodic system, preferably Ti. These metals have a high affinity to diamond due to their property to easily form carbides, why the diamond layer adheres extremely well to the substrate through this intermediate layer.

The non-diamond layer can also consist of carbides, nitrides, carbonitrides, oxycarbides, oxides and borides preferably of metals in group 4b to 6b of the periodic system and mixtures thereof. The following materials can be mentioned TiC, Ti(C,N), TiN, Ti(C,O), Ti(C,O,N), $Si_3N_4$, $Al_2O_3$, carbides of Zr, Hf, V, Nb, Ta, Cr, Mo, W, Si, B, mixtures of oxides and nitrides and/or oxynitrides of Cr, Al, Ca, Mg, Th, Sc, Y, La, Ti, Hf, Nb, Ta and the like. These can generally be described with the following chemical formula Me($C_xN_yO_zB_t$) where Me is one of the above mentioned metals and $0.45 < x+y+z+t < 2.1$.

In addition to above mentioned layers the non-diamond layers can consist of a noble metal.

The compound body according to the invention can be produced through deposition on a certain substrate of a layer of CVD-diamond or a combination of layers of non-diamond and CVD-diamond. When the coating comprises more than one layer of diamond the orders in which they are deposited can be any. E g a layer of diamond can be deposited first after which a second layer of non-diamond can be deposited after which further layers can be deposited comprising either only diamond or combination of diamond and non-diamond layers.

Even the layers between the diamond layers consist of the above mentioned materials.

The diamond layers can be deposited with CVD according to known technique with the use of a mixture of gaseous activated hydrocarbon and hydrogen which are brought in contact with the heated substrate. Each individual layer can be 0.1–10 $\mu$m thick, preferably 0.2–2 $\mu$m. When the coating comprises several the total thickness can reach 500 $\mu$m or more depending on the thickness of every individual layer and number. The number of layers can be two or more and comprise several layers of diamond separated by non-diamond layers.

The non-diamond layers can be deposited according to well-known CVD- or PVD-methods.

Coated bodies according to the invention have many applications within the industry.

One use is for parts subject to intensive wear e g extrusion dies, seal rings and thread-guides, milling and turning tools and the like for machining of metals as well as other material such as wood, plastic laminates and fibre composites. Tools equipped with inserts according to the invention have increased hardness and machining efficiency as well as pronounced increased wear life. This applies especially when coating comprises several diamond layers as the increased total diamond thickness effectively contributes to increased wear resistance.

The invention, especially with intermediate layers, has great usefulness thanks the outstanding corrosion and wear-resistance that the layer offers e g within the jewellery industry and for the production of e g watch-cases or other ornaments. In addition, the diamond layer on the outer surface has an attractive aspect in particular combined with an underlying layer of a noble metal.

Objects according to the invention have also use in the electronic industry, thanks to the good thermal conductivity of the diamond layer and/or the high isolation resistance. Thus, e g a coating of diamond possibly with an intermediate layer of silver or gold acts as an effective heat sink in semiconductor applications.

Furthermore, bodies according to the invention are useful as surgical tools.

Finally diamond layers are of use as radiation detectors in the medicine or nuclear technique for control of radiation dose.

The following examples illustrate the invention.

EXAMPLE 1

A cemented carbide insert is first coated with a 6 $\mu$m thick TiC-layer. The insert is then coated with an about 2 $\mu$m thick diamond layer.

The cutting properties of an insert according to this example for machining of Al-Si-alloys and other non-ferrous alloys and fibre reinforced plastics are markedly improved.

EXAMPLE 2

A Si-Al-O-N insert and an insert of pure ceramic are coated with an about 2 $\mu$m thick diamond layer.

Even in this case improved properties when machining non-ferrous alloys but also cast-iron are obtained.

EXAMPLE 3

A cemented carbide insert is coated first with a 2 $\mu$m thick TiC-layer according to known CVD-technique. Thereafter the insert is coated with an about 2 $\mu$m thick diamond layer. Finally the insert is coated with a 2 $\mu$m thick TiN-layer with PVD (Physical Vapour Deposition).

The insert has excellent properties when machining Si-containing Al-alloys.

EXAMPLE 4

Example 3 is repeated with the following exception: Between the TiC- and the diamond layer an about 0.1 $\mu$m thick Ti-layer with PVD is deposited in order to improve the adhesion.

Thos multilayer coating gives excellent results by reducing the tool failures during milling.

EXAMPLE 5

A cemented carbide drill is first coated with a layer of 0.1 $\mu$m TiN and 2 $\mu$m diamond according to earlier Example. The coating sequence is repeated six times resulting in a multilayer consisting of seven TiN and seven diamond layers with a total thickness of 15 $\mu$m. The drill is used for drilling in fibre reinforced plastic and metals. The penetration rate and wear resistance are excellent.

EXAMPLE 6

A seal ring of Si-Al-O-N is coated with a 3 $\mu$m CVD layer of diamond.

This wear part is tested in a palmoil pump. Generally palmoil is acid and it contains also sand and grit. The pumping of such oil therefore makes great demands on the seal rings. Seal ring coated with diamond according to the invention resists leaking much longer than conventional seal rings.

EXAMPLE 7

A thread guide of $Al_2O_3$ is first coated with a 0.1 $\mu$m thick layer of Ti and thereafter with an about 2 $\mu$m thick diamond layer. Double wear life is obtained.

EXAMPLE 8

A copper plate intended for use as a heat sink in the production of high-power semiconductors is first coated with a 0.1 $\mu$m thick layer of Ti with PVD and thereafter with a layer of diamond (5 $\mu$m). This layer adheres well to the copper owing to the interlayer of Ti. The presence of the diamond layer results in high heat conductivity at the same time as electric insulation is obtained.

EXAMPLE 9

Example 8 is repeated with the exception that the interlayer consists of gold (1 μm) and titanium (0.3 μm).

EXAMPLE 10

A watchcase of stainless steel is coated with 5 μm gold whereafter a 2 μm thick layer of diamond is deposited. The coating is very durable and very resistant to scratching in contrast to ordinary gold coated watches.

EXAMPLE 11

A watchcase of stainless steel is coated with 5 μm TiN whereafter a 2 μm thick layer of diamond is deposited. The coating is very durable and very resistant to scratching.

EXAMPLE 12

A cemented carbide insert is coated alternating with a 0.1 μm Ti-layer and a 2 μm diamond layer to total thickness of about 100 μm. The insert is used with good result for machining of sandstone.

We claim:

1. Compound body comprising a core of a material taken from the group consisting of a metal, metal alloy, metal-bonded hard metal compound, ceramic or mixtures thereof, said core being at least partly covered with a layer of one or more CVD-deposited layers of polycrystalline diamond, each said CVD-deposited layer being from 0.1 to 10 μm thick and being bonded to the substrate by a layer of a material selected from the group consisting of a noble metal, a metal which forms a stable carbide and a compound with the formula $Me(C_xN_yO_zB_t)$ where Me is a metal of Group 4b through 6b of the Periodic Table, Al or Si and $0.45 < x+y+z+t < 2.1$.

2. Compound body according to claim 1 characterized in that the core comprises an alloy with the main component a metal from group 1b to 7b and 8 in the periodic system, or any of these metals only.

3. Compound body according to claim 1 characterized in that the core comprises a noble metal, copper or aluminium.

4. Compound body according to claim 1 characterized in that the core comprises one or more hard phases of metal oxides, metal carbides, metal nitrides, metal borides or mixtures or solutions thereof, where the metal belongs to group 4b to 6b in the periodic system.

5. Compound body according to claim 4 characterized in that the core material contains a metal belonging to the iron group.

6. Compound body according to claim 1 characterized in that the core comprises at least one of the oxides of Al, Zr or Si or at least one of the nitrides of B, Si or Al.

7. Compound body according to claim 1 characterized in that the core consists of Si-Al-O-N.

8. Compound body according to claim 1 characterized in that the bonding layer is a noble metal.

9. Compound body according to claim 1 characterized in that the total thickness of the coating is between 0.1 and 500 μm.

10. Compound body of claim 9 wherein the total thickness of the coating is between 0.5 and 100 μm.

11. Compound body of claim 1 wherein the metal which forms a stable carbide is Ti.

12. In a drawing die having a drawing surface, the improvement which comprises using as the drawing surface a compound body comprising a core of a material taken from the group consisting of a metal, metal alloy, metal-bonded hard metal compound, ceramic or mixtures thereof, said core being at least partly covered with a layer of one or more CVD-deposited layers of polycrystalline diamond, each said CVD-deposited layer being from 0.1 to 10 μm thick and being bonded to the substrate by a layer of a material selected from the group consisting of a noble metal, a metal which forms a stable carbide and a compound with the formula $Me(C_xN_yO_zB_t)$ where Me is a metal of group 4b through 6b of the Periodic Table, Al or Si and $0.45 < x+y+z+t < 2.1$.

13. In an electronic component including a portion requiring at least one of extremely good thermal conductivity and high electrical isolation, the improvement which comprises using as the portion a compound body comprsing a core of a material taken from the group consisting of a metal, metal alloy, metal-bonded hard metal compound, ceramic or mixtures thereof, said core being at least partly covered with a layer of one or more CVD-deposited layers of polycrystalline diamond, each said CVD-deposited layer being from 0.1 to 10 μm thick and being bonded to the substrate by a layer of a material selected from the group consisting of a noble metal, a metal which forms a stable carbide and a compound with the formula $Me(C_xN_yO_zB_t)$ where Me is a metal of group 4b through 6b of the Periodic Table, Al or Si and $0.45 < x+y+z+t < 2.1$.

14. In a cutting tool including a wear surface, the improvement which comprises using as the wear surface a compound body comprising a core of a material taken from the group consisting of a metal, metal alloy, metal-bonded hard metal compound, ceramic or mixtures thereof, said core being at least partly covered with a layer of one or more CVD-deposited layers of polycrystalline diamond, each said CVD-deposited layer being from 0.1 to 10 μm thick and being bonded to the substrate by a layer of a material selected from the group consisting of a noble metal, a metal which forms a stable carbide and a compound with the formula $Me(C_xN_yO_zB_t)$ where Me is a metal of group 4b through 6b of the Periodic Table, Al or Si and $0.45 < x+y+z+t < 2.1$.

* * * * *